(12) United States Patent
Kurian

(10) Patent No.: US 8,120,163 B2
(45) Date of Patent: Feb. 21, 2012

(54) NON-RECIPROCAL DEVICE HAVING GROUNDING ARRANGEMENT AND METHOD OF INSTALLATION THEREOF

(75) Inventor: Thampy Kurian, Stow, MA (US)

(73) Assignee: Renaissance Electronics Corporation, Harvard, MA (US)

( * ) Notice: Subject to any disclaimer, the term of this patent is extended or adjusted under 35 U.S.C. 154(b) by 713 days.

(21) Appl. No.: 12/316,315

(22) Filed: Dec. 12, 2008

(65) Prior Publication Data

US 2010/0149732 A1    Jun. 17, 2010

(51) Int. Cl.
*H01L 23/02* (2006.01)
(52) U.S. Cl. .................... 257/690; 257/678; 438/106
(58) Field of Classification Search .............. 257/664, 257/665, 678, 698, 690; 438/106
See application file for complete search history.

(56) References Cited

U.S. PATENT DOCUMENTS

| 4,318,578 | A | * | 3/1982 | Ericson et al. | 439/106 |
| 4,589,195 | A | * | 5/1986 | Du Bois et al. | 29/856 |
| 5,294,897 | A | * | 3/1994 | Notani et al. | 333/33 |
| 7,943,850 | B2 | * | 5/2011 | Leopold et al. | 174/50 |

* cited by examiner

*Primary Examiner* — Sheila V. Clark
(74) *Attorney, Agent, or Firm* — Maine Cernota & Rardin

(57) ABSTRACT

A structure of a high frequency non-reciprocal passive device, such as circulator/isolator and method of installation. The structure includes a substantially rigid lip with cutouts for hot leads to go through. The walls of the cutout are situated in close proximity and symmetrically to the leads. The structure also having mounting holes. The installation process includes a step of putting the structure into a pocket in a carrier wherein a defined amount of a low heat transfer/electrical resistance substance, for example a grease, is located. The size of the lip is larger than the size of the pocket. Therefore the structure is supported on the rim of the pocket, while its portion which is under the lip and having smaller size is located in the pocket. Mounting screws can provide a predetermined pressure to the carrier by the device housing. By this, the lip is provided a reliable grounding in close proximity to the hot leads of the device, while the gap between the bottom of the pocket and the housing of the device is also defined and kept.

4 Claims, 3 Drawing Sheets

DETAIL A

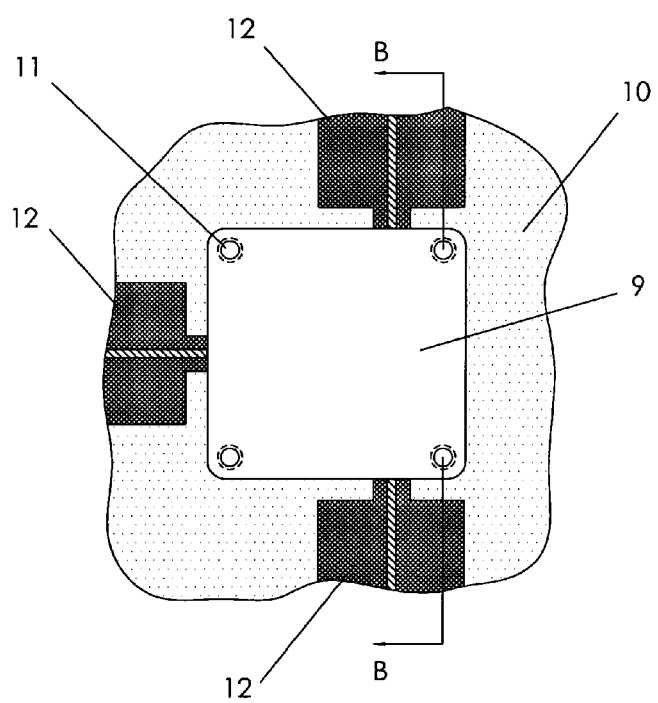
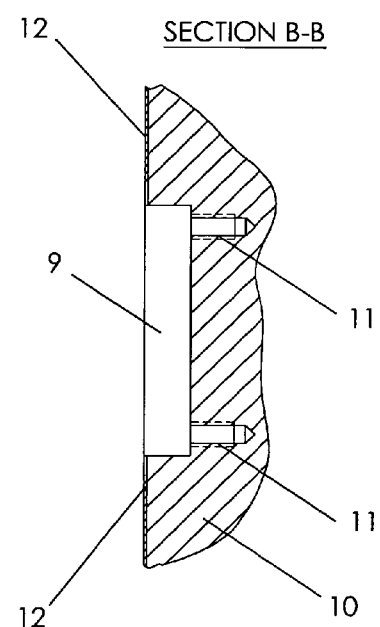
Fig. 4
Fig. 5

SECTION C-C

NON-RECIPROCAL DEVICE HAVING GROUNDING ARRANGEMENT AND METHOD OF INSTALLATION THEREOF

BACKGROUND OF THE INVENTION

The present invention relates to the non-reciprocal devices required reliable and uniform grounding in close proximity to their hot leads. More specifically, the present invention relates to the high frequency and relatively high power drop-in circulators/isolators which are mounted on a carrier while hot leads make contact with pcboard.

Conventional devices of that kind are usually secured to a carrier for heat transfer and grounding while hot leads make contact with the pcboard. On top of that they need at least two additional leads for port grounding on sides of and in close proximity to every hot lead. With thickness of leads so small as 0.003-0.010" and distance between leads of 0.020-0.050", the device installation while leads to be soldered to the pcboard traces is a tedious and time consuming work. Conventional circulator, for example, on top of three hot leads needs six grounding leads to be soldered to the pcboard. Also, every solder seam is different in terms of shape, dense and electrical characteristics. In high frequency systems even slight difference in uniformity on their ports can degrade a performance. So, the more solder seams needs to be done, the more degraded performance can be.

Typical structure of a conventional device having grounding leads on sides of hot leads is represented by U.S. Pat. No. 5,294,897.

Accordingly, what is needed is a minimum solder seams without sacrificing grounding on ports in close proximity to the hot leads with keeping heat transfer properties of the device.

BRIEF SUMMARY OF THE INVENTION

In the present invention the housing of the device having a lip all around periphery with a cutout for every hot lead. The leads are situated in the middle of cutouts. The device is installed in a pocket in a system carrier and secured to the carrier with installation screws while hot leads of the device are soldered to the pc board trace. The depth of the pocket (the distance from carrier top surface to the pocket's bottom) is larger than the distance from the device bottom to the lip. Installation screws when tightened are pressing the device lip to the carrier top surface while leaving some gap between the bottom of the device and the bottom of the pocket. This gap can be preliminary filled with low heat/electrical resistant material, for example, grease for better overall grounding and heat transfer properties of the device.

Thus, six grounding leads (for circulator) and accordingly six solder seams are eliminated relative to the conventional device. Proposed lip around the housing of the device provides uniform and reliable grounding in close proximity to the hot leads (because of the lip's rigidity with possibility to make it by machining as integral part of the housing). Contact made between the lip and the carrier is well controlled by the installation screws tension. A gap for grease under the bottom of the housing is also well defined and held.

BRIEF DESCRIPTION OF THE SEVERAL VIEWS OF THE DRAWINGS

FIG. 4 is a top view of a setup for installation of the device according to the present invention.

FIG. 5 is a sectional view of B-B as shown in FIG. 4.

DETAILED DESCRIPTION OF THE INVENTION

Figure 1:
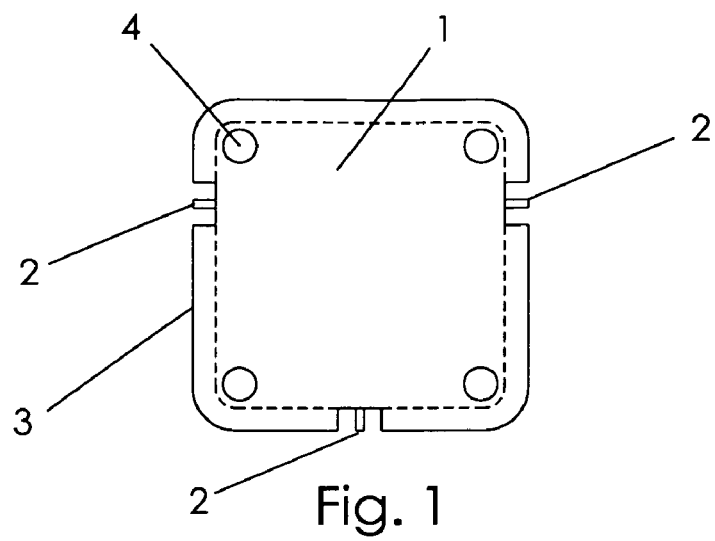
FIG. 1 shows top view of the device according to the present invention.
Figure 2:
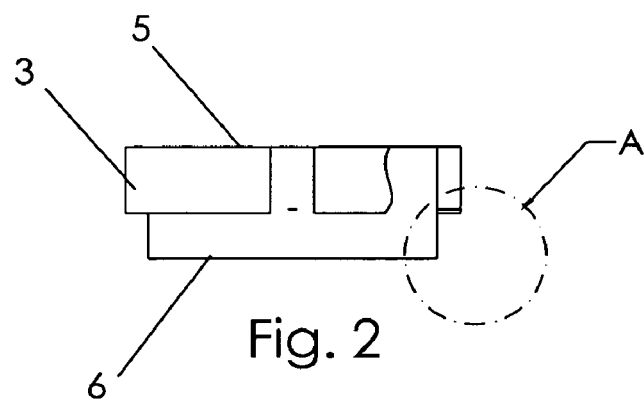
FIG. 2 is a bottom view of the device as shown in FIG. 1 with partially removed lip.
Figure 3:
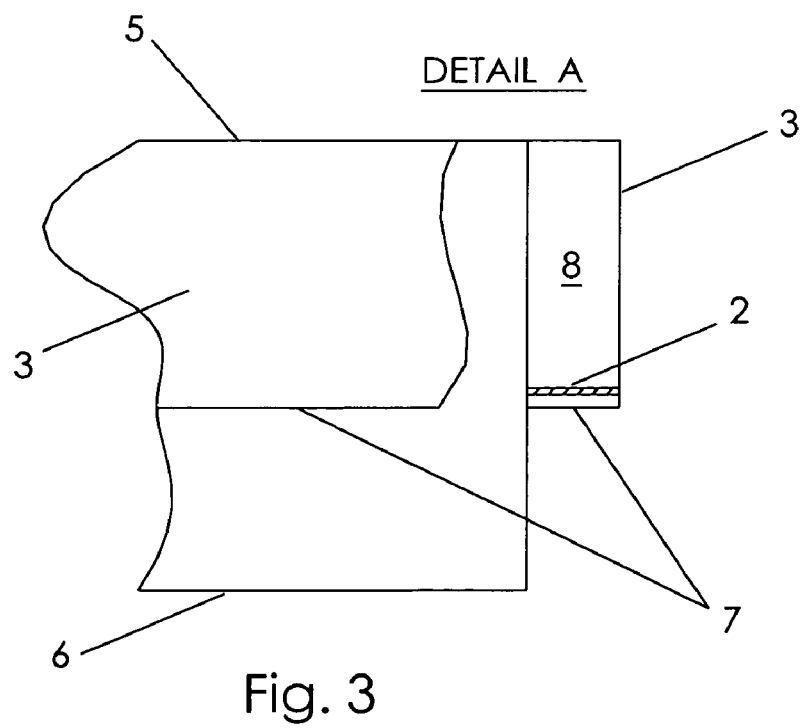
FIG. 3 is an enlarged view of detail "A" indicated in FIG. 2.

Referring to FIG. 1-FIG. 3 the structure according to the present invention comprises a housing 1 and hot leads 2. On sides of the housing 1 a lip 3 is formed. The housing 1 also includes mounting holes 4, top surface 5 and bottom surface 6. The lip 3 has a supporting surface 7 and cutouts 8 stretching from the top surface 5 to supporting surface 7 wherein hot leads 2 are located. Each hot lead 2 situated in the middle of every cutout 8 which is substantially narrow to provide a close proximity location of the lead 2 to the lip 3. The supporting surface 7 of the lip 3 is situated lower (see FIG. 3) than each lead 2.

Referring to FIG. 4-FIG. 7, in operation, the device according to the present invention is installed into a pocket 9 within a carrier 10. The pocket 9 has mounting holes 11 situated with the same pattern as holes 4 in the housing 1. On top surface of the carrier 10 pcboards 12 are located. Quantity of the pc boards 12 is the same as number of hot leads 2 in the device according to the invention.

The size of the pocket 9 in top view as shown in FIG. 4 is larger than the size of the bottom surface 6 of the housing 1 but smaller than the size of the lip 3. The depth of the pocket 9 as shown in FIG. 5 (section B-B) is larger than the distance between the supporting surface 7 of the lip 3 and the bottom surface 6 of the housing 1. So, in the installation process the pocket 9 can receive only the low portion of the device which is located under the lip 3, while the upper portion of the device will stay outside the pocket 9 being supported by the lip 3 with the supporting surface 7 is making contact with the carrier 10. Also, between the bottom surface 6 of the device and bottom of the pocket 9 a gap 13 will be formed. The size of the gap 13 will be defined by the difference in distance between the depth of the pocket 9 and the location of surface 6 of the housing 1 relative to the supporting surface 7.

Figure 6:
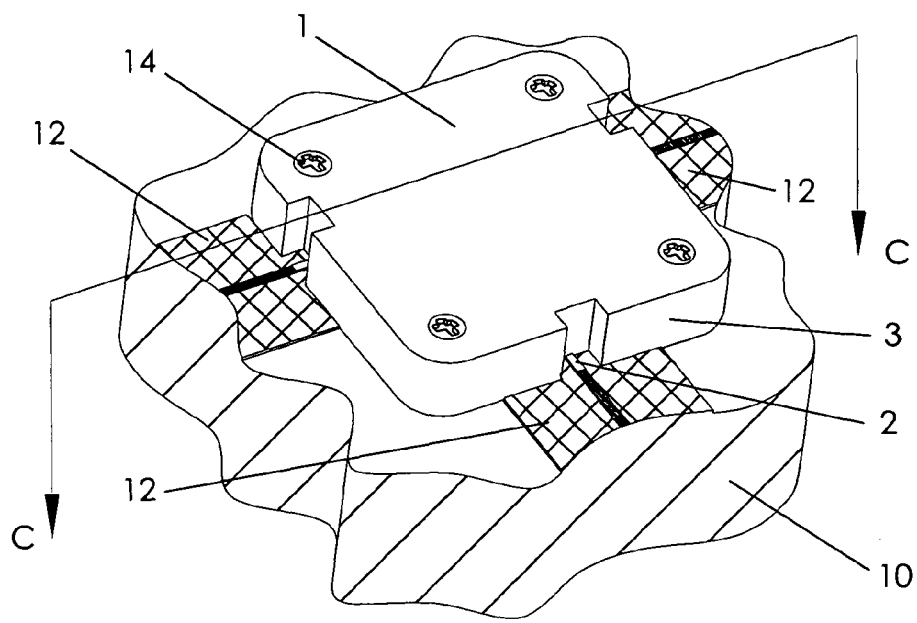
FIG. 6 is a perspective view of the proposed device mounted on pcboard in accordance with the present invention.
Figure 7:
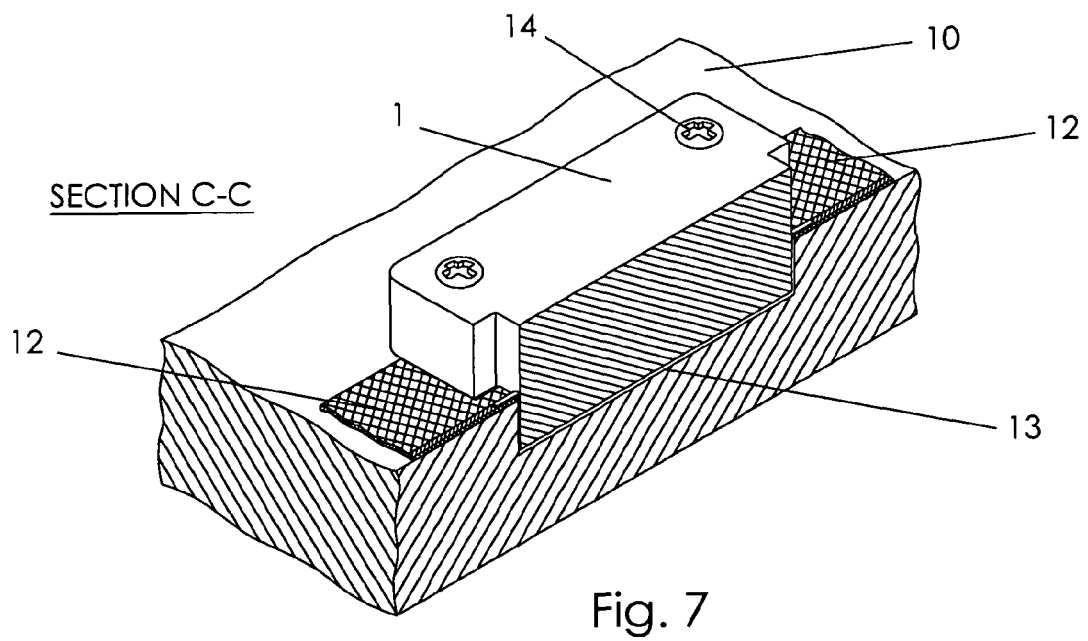
FIG. 7 is a perspective sectional view of C-C as shown in FIG. 6.

As was already mentioned the hot leads 2 are situated above of the supporting surface 7 (see FIG. 3). In FIG. 6 and FIG. 7 shown that when the device is installed in the pocket 9 the distance between the carrier 10 and the hot leads 2 is filled with the pc boards 12. The device is secured in place by mounting screws 14 that go through the holes 4 in the housing 1 and into the threaded holes 11 in the pocket 9. By securing the device in the pocket 9 the reliable grounding of the housing 1 to the carrier 10 in close proximity to the hot leads 2 is provided. The well defined gap 13 is also provided and can be filled with exact amount of a material (for example a grease) to diminish heat transfer and electrical resistance between the device and the carrier. The pressure on this filler can be controlled by the torque applied to the mounting screws 14 during the installation process.

When the invention having been described in detail, it is clear that there are variations and modifications to this disclosure here and above which will be readily apparent to one of ordinary skill in the art. To the extent that such variations and modifications of the present disclosure of the high frequency device having a lip for grounding with cutouts in close proximity to the hot leads that is installed in the pocket in a carrier with predetermined gap on the bottom to receive a low resistance heat transfer/electrical current substance, such are deemed within the scope of the present invention.

I claim:

1. A structure for a passive high frequency non-reciprocal device, comprising a housing having upper and lower portions, a plurality of hot leads, and mounting holes, wherein said top portion is situated on top of said lower portion creating a sandwich-like construction, said upper portion is substantially larger than said lower portion forming a lip all around said lower portion, said lip having cutouts in said top portion to provide a path for said hot leads, and said mounting holes going through both said portions.

2. A structure as recited in claim 1, wherein said cutout are substantially narrow to be in close proximity to said hot leads.

3. A structure as recited in claim 1, wherein said hot leads are situated symmetrically relative to said cutouts.

4. A method of installation a structure as recited in claim 1, comprising a preparation step, a step of locating the structure and a step of securing the structure, wherein a preparation step includes creating a pocket in a carrier with mounting holes on which the structure to be installed, said carrier to receive said lower portion, securing pc boards to which said hot leads to be connected, putting a low heat transfer/electrical substance on bottom of said pocket; a step of locating the structure includes putting said low portion of the structure in said pocket and electrically connecting said hot leads to said pc boards; a step of securing includes installation mounting screws through said mounting holes in said housing and secure said screws into said holes in said pocket.

* * * * *